(12) United States Patent
Azary et al.

(10) Patent No.: US 6,707,025 B2
(45) Date of Patent: Mar. 16, 2004

(54) HIGH DYNAMIC RANGE RECEIVER

(75) Inventors: Zoltan D Azary, Occidental, CA (US); Joseph N West, Petaluma, CA (US); Mohan Gurunathan, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/161,947

(22) Filed: Jun. 4, 2002

(65) Prior Publication Data

US 2003/0222206 A1 Dec. 4, 2003

(51) Int. Cl.$^7$ ................................................ H01J 40/14
(52) U.S. Cl. ........................ 250/214 AG; 250/214 LS; 330/278
(58) Field of Search ...................... 250/214 R, 214 A, 250/214 LA, 214 LS, 214 AG, 214 DC; 330/278, 282, 284, 285, 296; 327/514

(56) References Cited

U.S. PATENT DOCUMENTS

| 5,138,149 A | * | 8/1992 | Cadet et al. .......... 250/214 AG |
| 5,471,049 A | * | 11/1995 | Cain ........................ 250/208.2 |
| 5,786,730 A | * | 7/1998 | Hadley ......................... 330/59 |

* cited by examiner

Primary Examiner—Kevin Pyo
(74) Attorney, Agent, or Firm—John L. Imperato

(57) ABSTRACT

A high dynamic range receiver includes a detector that produces a current at a pair of terminals. A first gain element, implemented as a current-to-voltage converter for example, is coupled to the first terminal, receiving the current and generating a first output signal corresponding to the current. A second gain element, implemented as a current-to-voltage converter for example, is coupled to the second terminal, receiving the current and generating a second output signal corresponding to the received current. A switch selectively couples the first output signal or the second output signal to a port based on a comparison of at least one of the first output signal and the second output signal to a threshold.

17 Claims, 4 Drawing Sheets

HIGH DYNAMIC RANGE RECEIVER

BACKGROUND OF THE INVENTION

Many optical and electrical systems include high dynamic range receivers that detect and process signals having power levels that vary over a wide range. A high dynamic range receiver has enough sensitivity to detect and process an applied signal having a low power level, but avoids becoming overloaded when the applied signal has a high power level. A typical prior art receiver, shown in FIG. 1, includes a switched-gain amplifier having an input that is connected to a single terminal of a detector that receives an applied signal. The switched-gain amplifier has two alternative gain settings—a high gain setting for when the applied signal has a low power level, and a low gain setting for when the applied signal has a high power level. The switched-gain amplifier includes either a mechanical relay or a solid state switch to alternatively select gain-setting resistors in a feedback path of the switched-gain amplifier. A solid state switch has the benefit of fast switching of the gain-setting resistors, but has the disadvantages of introducing leakage current and noise in the feedback path of the switched-gain amplifier, degrading the low-level sensitivity of the receiver. A mechanical relay has the benefits of low noise and low leakage, but provides for slow switching of the gain-setting resistors, which results in switching delay periods during which the receiver is inoperable for detection and processing of the applied signals. Accordingly, there is a need for a high dynamic range receiver that avoids the switching of gain-setting resistors in an amplifier feedback path and that overcomes the shortcomings of this type of prior art receiver.

SUMMARY OF THE INVENTION

A high dynamic range receiver constructed according to the embodiments of the present invention has enough sensitivity to detect and process applied signals having low power, avoids becoming overloaded when the applied signal has high power, and does not rely on switching in the feedback path of an amplifier. The receiver includes a detector or other current source that produces a current at a pair of terminals. A first gain element, implemented as a current-to-voltage converter for example, is coupled to the first terminal, receiving the current and generating a first output signal corresponding to the current. A second gain element, implemented as a current-to-voltage converter for example, is coupled to the second terminal, receiving the current and generating a second output signal corresponding to the received current. A switch selectively couples the first output signal or the second output signal to a port based on a comparison of at least one of the first output signal and the second output signal to a threshold.

DETAILED DESCRIPTION OF THE EMBODIMENTS

Figure 1:
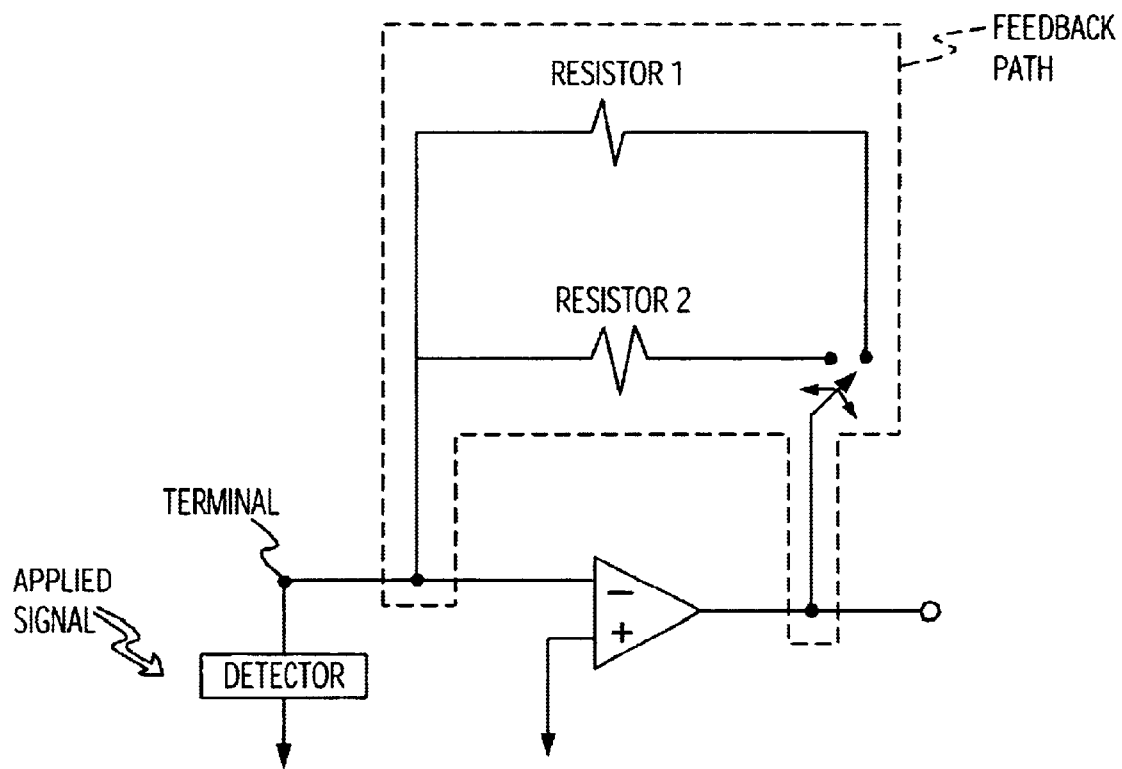
FIG. 1 shows a prior art receiver.
Figure 2:
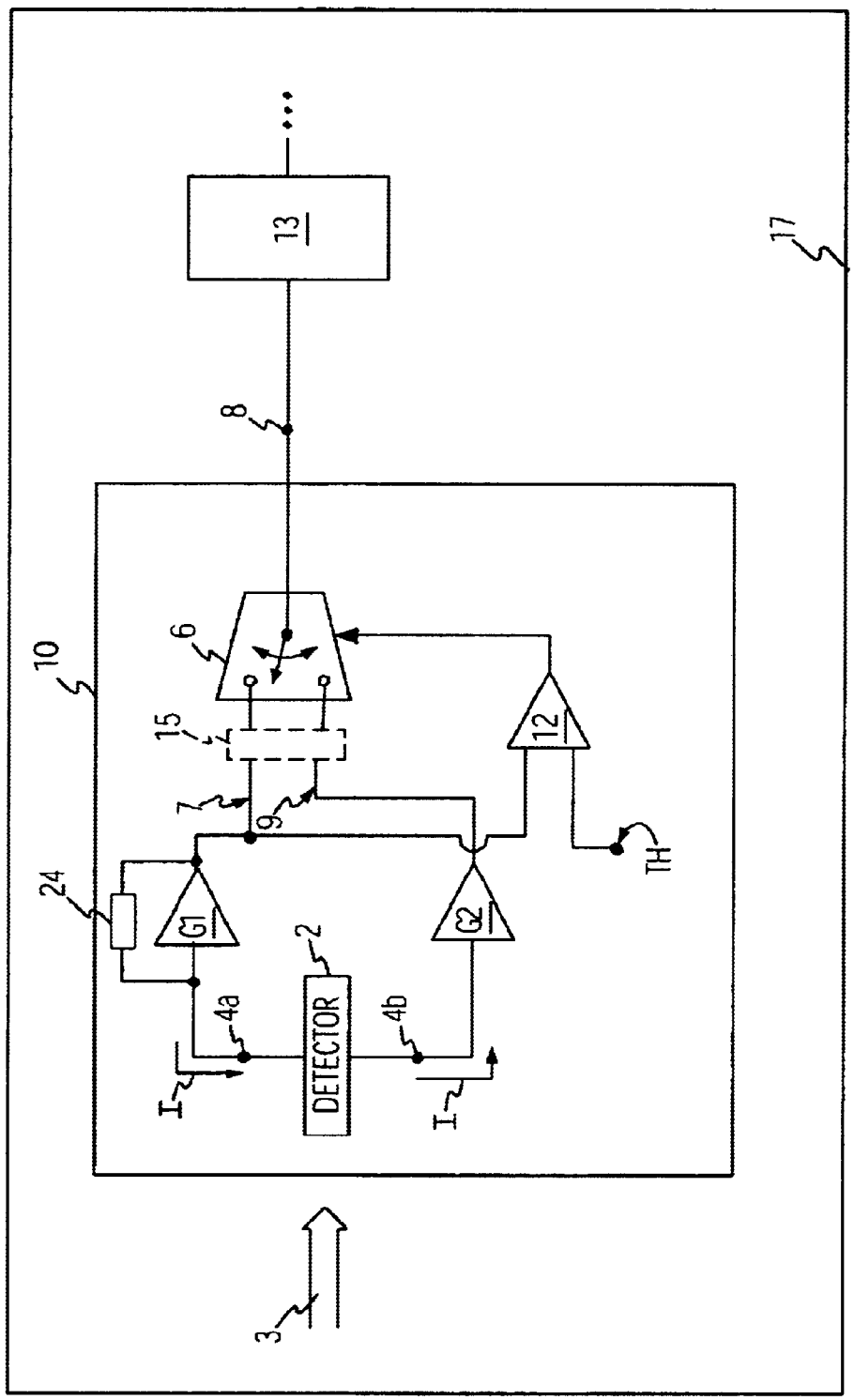
FIG. 2 shows a high dynamic range receiver constructed according to the embodiment of the present invention.
Figure 3:
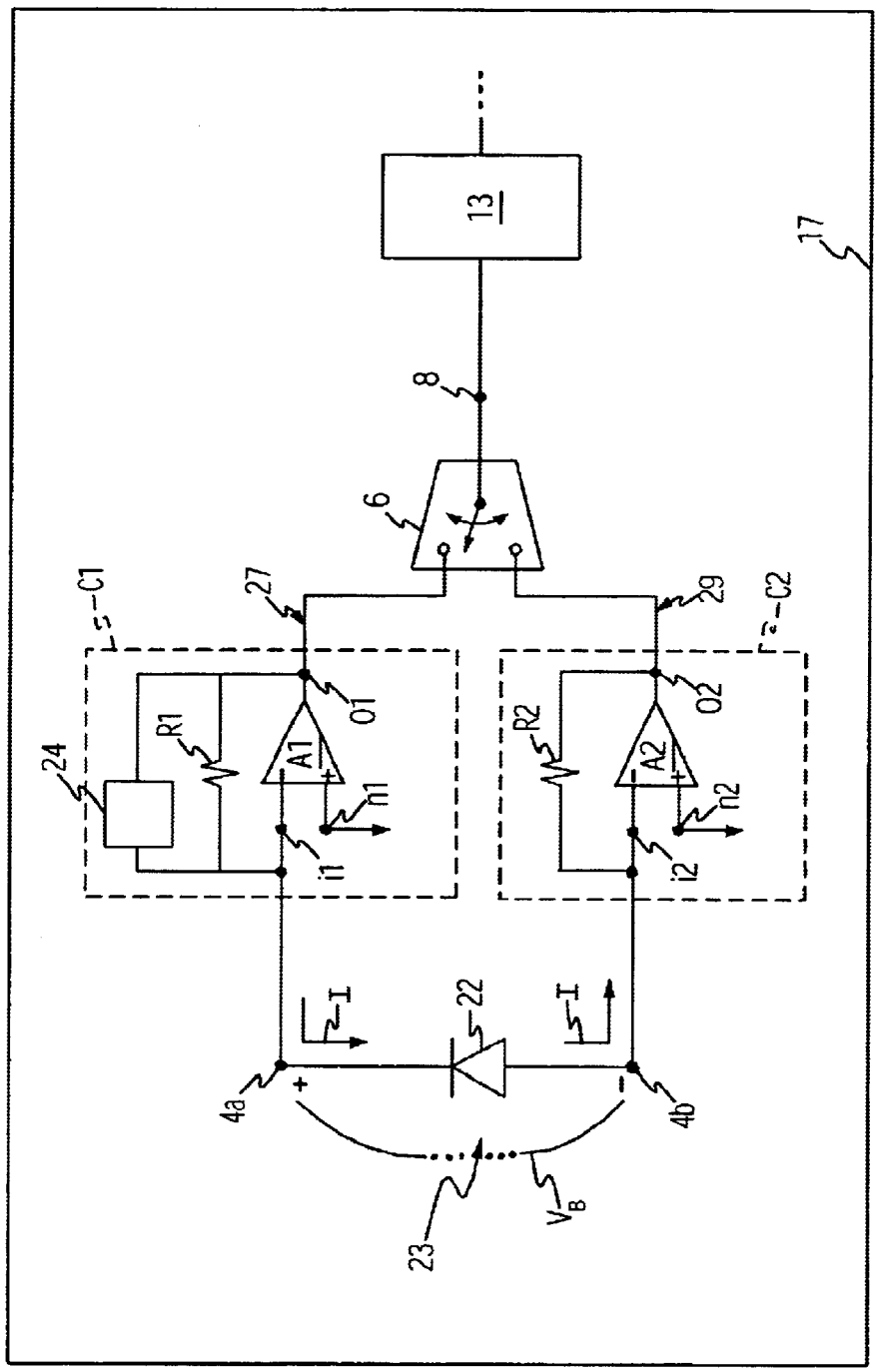
FIG. 3 shows an example of the high dynamic range receiver of FIG. 2, suitable for inclusion in an optical system.

FIG. 2 shows a high dynamic range receiver (hereafter receiver 10) constructed according to the embodiment of the present invention. The receiver 10 is suitable for inclusion in signal power meters, spectrum analyzers, network analyzers, signal analyzers, or any other of a variety of optical or electrical instruments or systems. An example of the receiver 10 suitable for inclusion in an optical system is shown in FIG. 3.

In FIG. 2, the receiver 10 includes a detector 2 that intercepts or receives an applied signal 3. The type of detector 2 included in the receiver 10 depends on the nature of applied signal 3. For example, the detector 2 is a photodiode, sensor or transducer that produces a response current I at terminals 4a, 4b in response to the applied signal 3, where the applied signal 3 is optical, electrical, mechanical, or environmental in nature. However, the detector 2 is any other type of current source, or current generating device or system that results in the response current I being present at each of the terminals 4a, 4b. Response currents I that span an amplitude range of five or more decades are typically encountered when the receiver 10 is included in an optical or electrical system, due to the applied signal 3 having a wide range of power levels.

A gain element G1 is coupled to a terminal 4a of the detector 2 and a gain element G2 is coupled to a terminal 4b of the detector 2, and each of the gain elements G1, G2 receive the response current I. The gain elements are current amplifiers, current-to-voltage converters, or other amplifiers, gain stages or buffers, depending on the signal requirements of the signal converters, processors or conditioners 13 of the system 17 within which the receiver 10 is included. For example, current amplifiers provide output signals 7, 9 that are currents, current-to-voltage converters provide output signals 7, 9 that are voltages, while other amplifiers, gain stages, or buffers provide the output signals 7, 9 with any of a variety of signal levels or types.

Designating the gain element G1 to have high gain and low noise performance and designating the gain element G2 to have high power-handling capacity enables the combination of the gain element G1 and the gain element G2 to accommodate a wide range of response currents I. Accommodating a wide range of response currents I, in turn, enables the receiver 10 to detect and process applied signals 3 having power levels that also span a wide range.

The gain element G1 receives the response current I at the terminal 4a and provides an output signal 7 in response to the received response currents I. The high gain and low noise performance of the gain element G1 accommodates low-amplitude response currents I. Since low-amplitude response currents I generally correspond to applied signals 3 that have low power, the gain element G1 provides the receiver 10 with enough sensitivity to adequately detect and process these low-power applied signals 3.

The gain element G2 receives the response current I at the terminal 4b and provides an output signal 9 in response to the received response current I. The high power-handling capacity of the gain element G2 prevents the gain element G2 from being overloaded when the response current I has high amplitude, thereby enabling the gain element G2 to accommodate high-amplitude response currents I. Since high-amplitude response currents I generally correspond to applied signals 3 that have high power, the gain element G2 provides the receiver 10 with enough high power capability to adequately detect and process these high-power applied signals 3.

Typically, the gain element G2 is designated to have lower gain than the gain element G1, resulting in the gain element G2 having higher bandwidth than the gain element G1 due to the gain/bandwidth tradeoff inherent in many types of gain elements. Therefore, when the applied signal 3 has high power, use of the gain element G2 rather than the gain element G1, enables the receiver 10 to have a faster response time.

In a typical application of the receiver 10, one of the output signals 7, 9 is coupled to signal converters, processors or conditioners 13 of the system 17 in which the receiver 10 is included, via a port 8. The port 8 is a node, terminal or other access point to the receiver 10.

A switch 6 selectively couples either the output signal 7 or the output signal 9 to the port 8. In the example shown, the switch 6 is driven by a comparator 12. The comparator 12 compares the output signal 7 to a threshold TH, and drives the switch 6 to couple the output signal 7 to the port 8 when the magnitude of the output signal 7 exceeds the threshold TH and to couple the output signal 9 to the port 8 when the magnitude of the output signal 7 does not exceed the threshold TH. Alternatively, the comparator 12 compares the output signal 9 to a threshold TH and drives the switch 6 to couple the output signal 7 to the port 8 when the magnitude of the output signal 9 does not exceed the threshold TH and to couple the output signal 9 to the port 8 when the magnitude of the output signal 9 exceeds the threshold TH. In these examples, the switch 6 is driven based on the threshold TH being exceeded. However, any other suitable decision criteria, which result in the switch 6 being driven based on comparison of one or both of the output signals 7, 9 to the threshold TH, are alternatively used. The threshold TH is designated by a voltage or current, suitable for comparison to the output signals 7, 9. Alternatively, the threshold TH is designated to be a noise noise level or other signal characteristic used as bases for selectively coupling the output signals 7, 9 to the port 8.

In another example, one or more analog-to-digital converters or other digitizer 15 is interposed between the gain elements G1, G2 and the switch 6. The digitizer 15 intercepts and digitizes one or both of the output signals 7, 9. In the example shown in FIG. 2, the digitizer 15 intercepts both of the output signals 7, 9. Alternatively, the digitizer 15 intercepts one of the output signals 7, 9. Digitized representations of one or both of the output signals 7, 9 are then compared to a digital threshold TH, providing a basis for selecting the one of the output signals 7, 9 for further processing or conditioning by the system 17. This comparison enables the switch 6 in this latter example to be implemented in hardware, software, or combinations of hardware and software. In addition to these examples, any other method or technique for selectively coupling, or otherwise designating, one of the output signals 7, 9 according to the magnitude of one or both of the output signals 7, 9 for further processing or conditioning, is alternatively used.

A correspondence between the power level of the applied signal 3 and the output signals 7, 9 also enables selective coupling of the output signals 7, 9 to the port 8 to be based on a designated power level of the applied signal 3, for example, by independent detection of the power level of the applied signal 3 or by a predetermination of the power level of the applied signal.

In the implementation of the receiver 10 that is shown in FIG. 3, the detector 2 is a photodiode 22, the applied signal 3 is an optical signal 23, and the response current I corresponds to the intensity of the optical signal 23 that is intercepted by the detector 2. An exemplary range for the response current I spans from 10 picoamperes to 10 milliamperes. However, this range of response currents I depends on the transfer characteristics of the photodiode 22, a bias voltage VB across the terminals 4a, 4b, and the range of intensity of the optical signal 23. The response current I is provided at each of the terminals 4a, 4b of the photodiode 22.

The gain element G1 is implemented in this example as a current-to-voltage converter C1 that receives the current I and provides an output voltage 27 in response to the received response current I. The current-to-voltage converter C1 is shown as an operational amplifier A1 in an inverting configuration, having again that is established by a feedback resistor R1. A low-noise operational amplifier A1 having high input impedance and low input offset current, such as the BURR BROWN OPA-111, available from TEXAS INSTRUMENTS, INC., Dallas, Tex., is well suited for use in the current-to-voltage converter C1. The current-to-voltage converter C1 is alternatively implemented using one or more discrete amplification stages (not shown) that provide the output voltage 27 in response to the received response current I.

The gain element G2 is implemented in this example as a current-to-voltage converter C2 that receives the response current I and provides an output voltage 29 in response to the received response current I. The current-to-voltage converter C2 is shown as an operational amplifier in an inverting configuration, having a gain that is established by a feedback resistor R2. Selecting the feedback resistor R2 to be less than the feedback resistor R1 provides the current-to-voltage converter C2 with proportionately lower gain than the current-to-voltage converter C1. An operational amplifier A2 having high current-handling capacity, such as the BURR BROWN OPA-627, also available from TEXAS INSTRUMENTS, INC., Dallas, Tex., is well suited for use in the current-to-voltage converter. The current-to-voltage converter is alternatively implemented using one or more discrete amplification stages (not shown) that provide the output voltage 29 in response to the received response current I.

Coupling the switch 6 to outputs O1, O2 of the current-to-voltage converters C1, C2, respectively, reduces the effects leakage current, noise and other characteristics of the switch 6 on the output voltages 27, 29.

Photodiodes 22 and other types of detectors 2 are typically specified to operate with a designated bias voltage VB, provided across the terminals 4a, 4b, that is a constant or a variable voltage. The bias voltage VB shown in this example is a constant zero volts, established by setting a noninverting input n1 of the operational amplifier A1 and a noninverting input n2 of the operational amplifier A2 to the same potential, such as ground. Bias voltages VB other than zero are established by setting the noninverting terminals n1, n2 of the operation amplifiers A1, A2, respectively, to different potentials. To maintain the designated bias voltage VB across the terminals 4a, 4b of the photodiode 22, the current-to-voltage converter C1 includes an optional clamp 24, so that the operational amplifier A1 will maintain an inverting input i1 at the same potential, or voltage, as the noninverting input n1, independent of the magnitude of the response current I.

Figure 4:
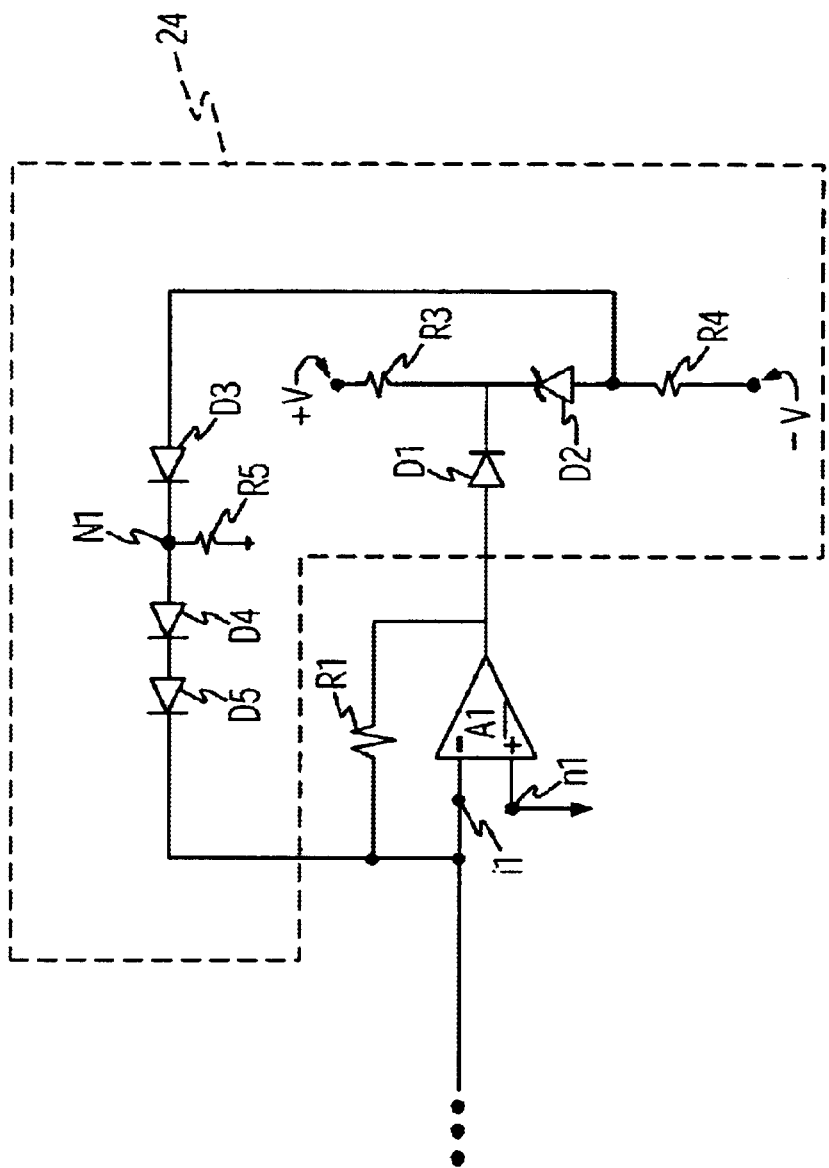
FIG. 4 shows an example of a clamp, optionally included in the high dynamic range receiver of FIGS. 2–3.

FIG. 4 shows an example of the clamp 24 optionally included in the high dynamic range receiver 10 of FIGS. 2–3. A Zener diode D2 is kept in conduction by a resistor R3 and a resistor R4, having sufficiently low resistance values to provide conduction through a diode D1 when the output of the amplifier A1 is within a designated voltage range of a clamping voltage level of the output voltage 27. A diode D3 and a resistor R5 maintain node N1 at ground until the clamp 24 is activated. This minimizes the voltage across diodes D4 and D5, thereby minimizing leakage current at the inverting input i1 of the operational amplifier A1. Once the response current I becomes large enough, the diode D1 conducts, in turn, causing the diode D3 to conduct. This results in conduction through the diodes D4, D5, which provides clamping action to maintains the inverting input i1 of the operational amplifier A1 at the same potential as the noninverting input n1 of the operational amplifier A1, even in the presence of further increases in the response current I. The diode D5 is chosen to have low current leakage, while the diode D4 is chosen to have high switching speed. While FIG. 4 is an exemplary implementation of the optionally-included clamp 24, any other type of clamp 24 that maintains the bias voltage VB across the terminals 4a, 4b of the photodiode 22 is suitable.

While the embodiments of the present invention have been illustrated in detail, it should be apparent that modifications and adaptations to these embodiments may occur to one skilled in the art without departing from the scope of the present invention as set forth in the following claims.

What is claimed is:

1. A receiver, comprising:
   a detector having a first terminal and a second terminal, and producing a current at the first terminal and the second terminal;
   a first gain element coupled to the first terminal, receiving the current and generating a first output signal corresponding to the current;
   a second gain element coupled to the second terminal, receiving the current and generating a second output signal corresponding to the received current; and
   a switch selectively coupling one of the first output signal and the second output signal to a port based on a comparison of at least one of the first output signal and the second output signal to a threshold.

2. The receiver of claim 1 wherein the first gain element is a current-to-voltage converter having a first gain and the second gain element is a current-to-voltage converter having a second gain that is less than the first gain.

3. The receiver of claim 1 wherein the switch couples the second output signal to the port when a designated one of the first output signal and the second output signal has a magnitude that exceeds the threshold.

4. The receiver of claim 1 wherein the switch couples the first output signal to the port when a designated one of the first output signal and the second output signal has a magnitude that does not exceed the threshold.

5. The receiver of claim 1 further including a digitizer intercepting at least one of the first output signal and the second output signal and generating a digitized representation of the at least one of the first output signal and the second output signal, wherein the comparison of the at least one of the first output signal and the second output signal to the threshold includes comparing the digitized representation to a digital threshold.

6. The receiver of claim 1 wherein the detector is a photodiode producing the current at the first terminal and the second terminal in response to an optical signal applied to the photodiode.

7. The receiver of claim 1 wherein the detector is a current source producing the current at the first terminal and the second terminal.

8. The receiver of claim 1 wherein the first gain element and the second gain element establish a bias voltage between the first terminal and the second terminal of the detector.

9. The receiver of claim 2 wherein the detector is a photodiode producing the current at the first terminal and the second terminal in response to an optical signal applied to the photodiode.

10. The receiver of claim 2 wherein the detector is a current source producing the current at the first terminal and the second terminal.

11. The receiver of claim 2 wherein the first gain element and the second gain element establish a bias voltage between the first terminal and the second terminal of the detector.

12. The receiver of claim 2 wherein the current-to-voltage converter having the first gain includes an operational amplifier in an inverting configuration and the current-to-voltage converter having the second gain includes an operational amplifier in an inverting configuration.

13. The receiver of claim 3 wherein the switch couples the first output signal to the port when a designated one of the first output signal and the second output signal has a magnitude that does not exceed the threshold.

14. The receiver of claim 8 wherein the first gain element further includes a clamp, maintaining the bias voltage between the first terminal and the second terminal, independent of the current at the first terminal and the second terminal.

15. The receiver of claim 11 wherein the first gain element further includes a clamp, maintaining the bias voltage between the first terminal and the second terminal, independent of the current at the first terminal and the second terminal.

16. The receiver of claim 14 wherein the detector is a photodiode producing the current at the first terminal and the second terminal in response to an optical signal applied to the photodiode.

17. The receiver of claim 15 wherein the detector is a photodiode producing the current at the first terminal and the second terminal in response to an optical signal applied to the photodiode.

* * * * *